United States Patent [19]
Nemes

[11] Patent Number: 5,321,888
[45] Date of Patent: Jun. 21, 1994

[54] INTEGRATED LIGHTWEIGHT CARD RACK

[75] Inventor: Les E. Nemes, Buena Park, Calif.

[73] Assignee: Rockwell International Corporation, Seal Beach, Calif.

[21] Appl. No.: 878,595

[22] Filed: May 5, 1992

Related U.S. Application Data

[62] Division of Ser. No. 785,632, Oct. 31, 1991, Pat. No. 5,225,964.

[51] Int. Cl.$^5$ .............................................. B23P 15/26
[52] U.S. Cl. .......................... 29/890.054; 29/890.03; 165/80.2; 165/80.4
[58] Field of Search ............ 29/890.03, 890.054, 29/829, 830, 846, 848; 165/109.1, 80.2, 80.4, DIG. 907; 174/16.3; 361/386

[56] References Cited

U.S. PATENT DOCUMENTS

| | | | |
|---|---|---|---|
| 4,800,956 | 1/1989 | Hamburger | 165/80.4 |
| 4,879,891 | 11/1989 | Hinshaw | 165/80.4 |
| 5,099,910 | 3/1992 | Walpole et al. | 165/80.4 |
| 5,125,451 | 6/1992 | Matthews | 165/80.4 |
| 5,145,001 | 9/1992 | Valenzuela | 165/907 |

*Primary Examiner*—Irene Cuda
*Attorney, Agent, or Firm*—H. Frederick Hamann; George A. Montanye; Tom Streeter

[57] ABSTRACT

A plurality of heat sinks assembled to form a rack in a lightweight box accommodate printed circuit cards between the heat sinks and circulate cooling oil through the heat sinks to drain the test heat from the boards quickly. Each heat sink includes a porous metal foam core configured in zigzag shape to provide a tortuous path for the fluid flow which extends into lateral fins comprising the side plates of the metal foam for receiving the cards or ground plates therefore. These plates are clamped against the fins for close contact to the cooling fluid thereby shortening the heat flow path. Brazed on aluminum top and bottom cover plates make a fluid tight connection with the porous metal. The brazed on top and bottom plates are also configured in the zigzag pattern of the foam. Lightweight thin aluminum feelers or plates conform to the zigzag sides of the foam and are clamped there against by side covers so that the feelers melt in a brazing process for sealing the side covers in fluid tight core conforming relationship with the foam metal core. After brazing the side covers have milled uniform slots formed along their exteriors for receiving the boards which are clamped against one side of the so-formed fins by wedge locking devices.

3 Claims, 15 Drawing Sheets

INTEGRATED LIGHTWEIGHT CARD RACK

This is a divisional application of copending application Ser. No. 07/785,632 filed on Oct. 31, 1991, now U.S. Pat. No. 5,225,964.

BACKGROUND OF THE INVENTION

1. Field of the Invention

The invention is a new lightweight card rack for printed wiring boards and method of more efficiently extracting the heat from the boards immediately upon testing completion.

2. Prior Art

Prior art heat extractors suffer from three large disadvantages:
1. They are inefficient in removing heat,
2. They do not minimize the length of the heat removal path, and,
3. They are bulky and heavy.

SUMMARY OF THE INVENTION

A plurality of heat sinks assembled to form a rack in a lightweight box accommodate the cards between the heat sinks and circulate cooling oil through the heat sinks to drain the test heat from the boards quickly. Each heat sink comprises a porous metal foam core configured in zigzag shape to provide a tortuous path for the fluid flow which extends into fins comprising the side plates of the metal foam metal fins receive the cards or ground plates therefore. These plates are clamped against the fins for close contact to the cooling fluid thereby shortening the heat flow path. Brazed on aluminum top and bottom cover plates make a fluid tight connection with the porous metal. The brazed on top and bottom plates and the porous metal foam are configured in the same zigzag patterns simultaneously by a programmed electric discharge machine. Lightweight thin aluminum feelers shaped to conform to the zigzag sides of the foam are clamped thereagainst by side covers so that the feelers melt in a brazing process for sealing the side covers in fluid tight core conforming relationship with the foam metal core. After brazing, the side covers have milled uniform slots formed along their exteriors for receiving the boards which are clamped against one side of the so-formed fins by wedge locking devices. The heat sinks are terminated in fluid communicating blocks which receive fluid communicating bellows so that, e.g., four heat sinks (cold plates) are assembled in spaced relation across a rack or box bottom plate, preferably of foam metal covered by aluminum on both sides. Then, four stacks of these cold plates comprise the proper height for receiving the card or board edges. The corner blocks on one side are terminated in an input manifold and an output manifold for directing cooling oil into and out of the bellows and foam cores for cooling the cards. Four or five graphite window frames also having a top and bottom flange surround and hold in position the cold plates within the rack which has a rack top with foam metal core, and lightweight aluminum sides.

DETAILED DESCRIPTION OF A PREFERRED EMBODIMENT OF THE INVENTION

The invention is an integrated cooled lightweight card rack for containing printed wiring boards for particularly heavy duty applications, which card rack is utilized for testing the printed wiring board by applying predetermined amounts of heat generated by currents applied to the boards, then rapidly removing the heat;

and also permitting vibration and other tests to rigid specifications.

Figures 1, 1A:
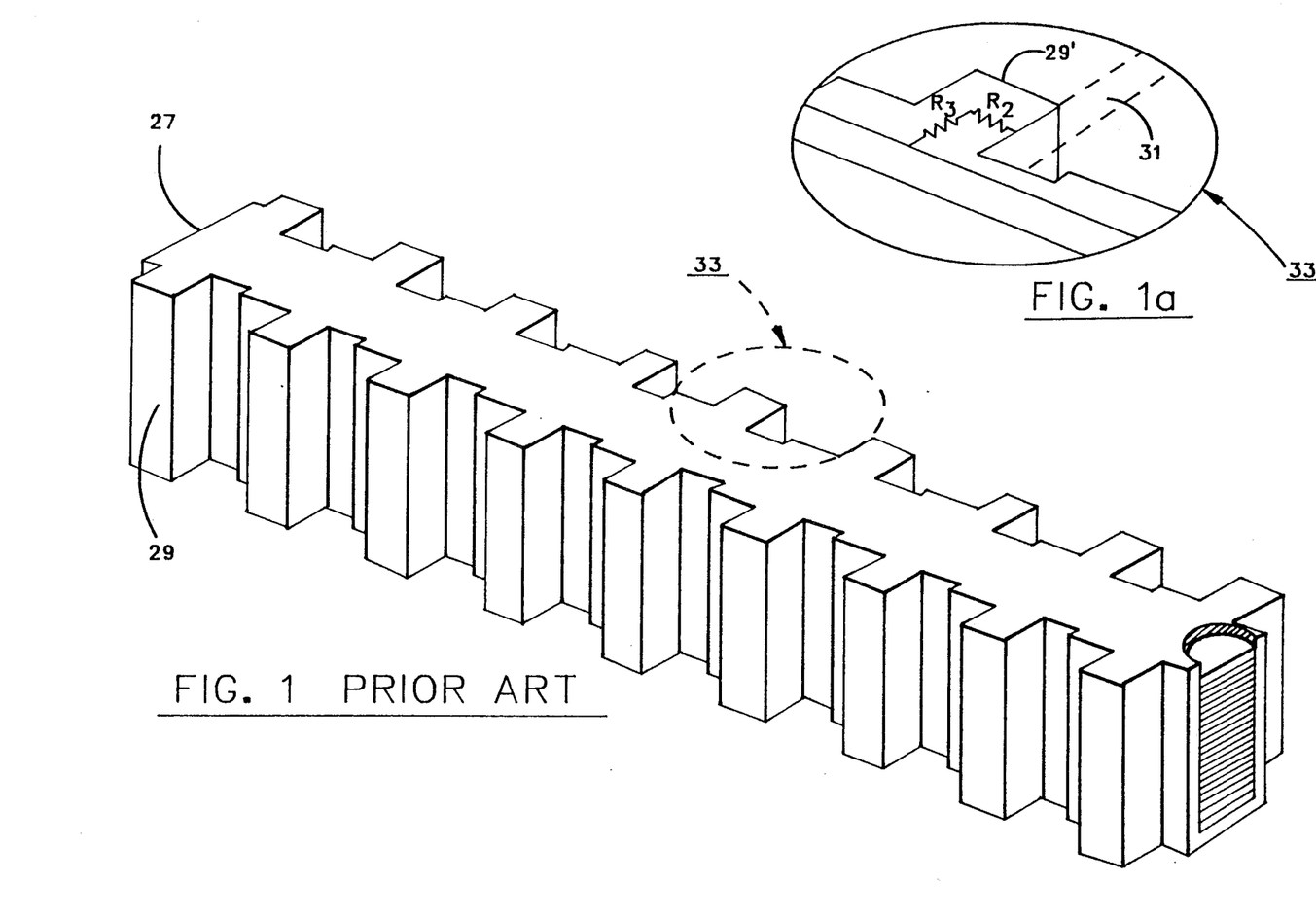
FIG. 1 shows a prior art cast metal heat sink having a fluid path along the axis thereof.
FIG. 1a is a detail view of one of the fins shown in FIG. 1.

In FIGS. 1 and 1A, a prior art type heat sink for the rack is shown in perspective comprising a relatively heavy metal casting 27 with radiating fins 29 and with the inset showing typical heat flow resistance paths R2 and R3. R1, which is not shown, is located along the wiring board to the edge of a fin 29. The printed wiring board 31 is clamped against the fin 29', and the heat flow from the heated printed circuit must travel up the wiring board 31, across a portion of the fin 29 (R2), then inwardly to the circulating fluid, generally located at 33, causing the further heat resistance path R3 to be added to R2 and R1. Reference numeral 31 may alternatively refer to a ground plane or support therefor, as such components generally offer less resistance to heat flow than does the wiring board per se.

In the formula $$R = \frac{L}{K \times A}$$

R is the total heat resistance, L is the length of the heat path, K is a fixed coefficient of thermal conductivity and A is the area of the printed wiring board to be cooled.

Since K and A are constants, once a card size is selected, then only L can be diminished to reduce the heat resistance R. Thus, the present invention employs materials and arrangements of the materials to diminish the thermal resistance R. Also, due to the unique method of fabrication, the invention provides, among other things, the most efficient way to remove heat known to date, a lightweight structure, and a readily machinable device which may be assembled using known processes.

Figure 2:
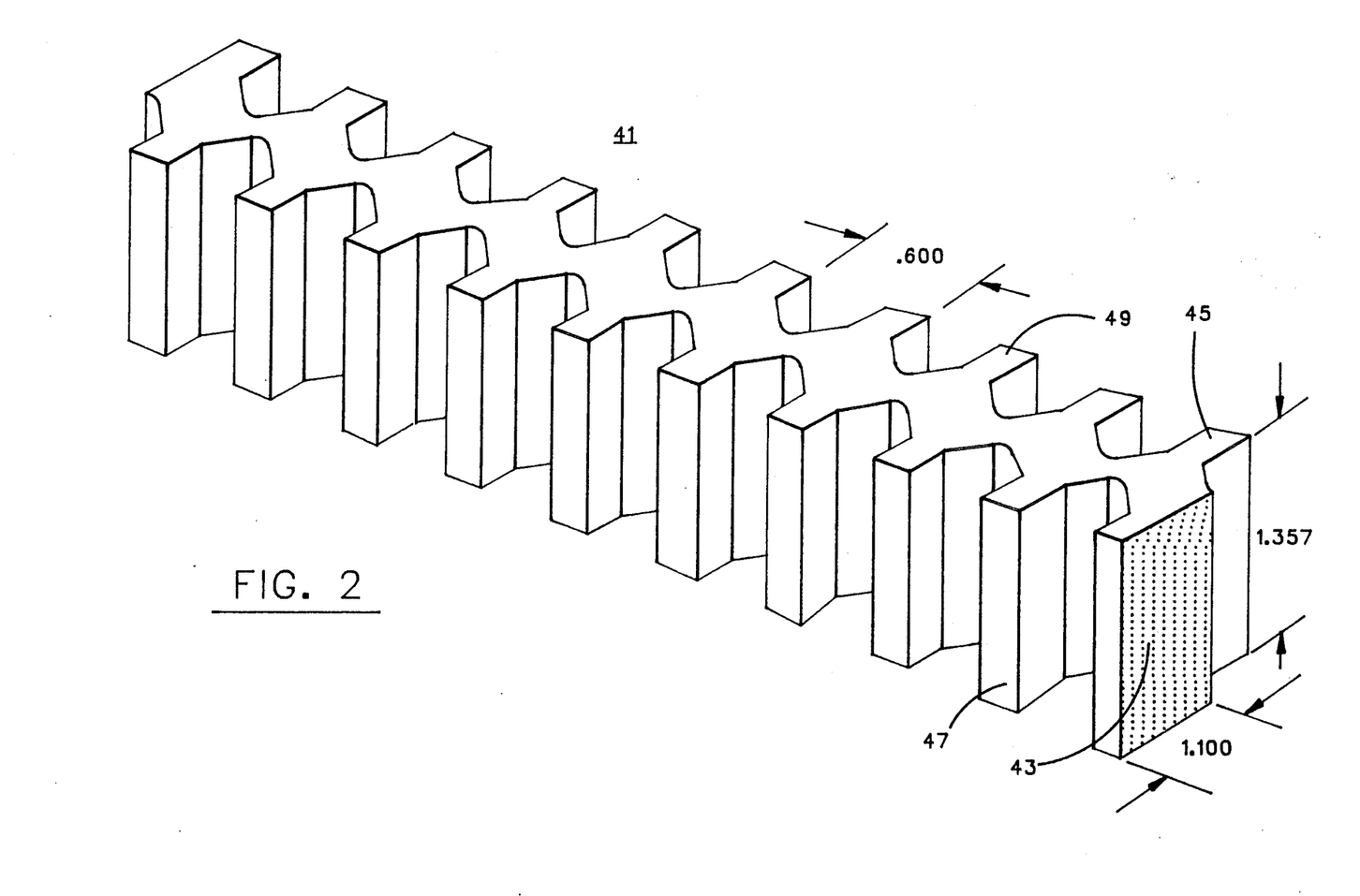
FIG. 2 is a view in perspective of the heat sink core of the present invention showing the fluid porous foam metal with a lightweight aluminum top cover and aluminum bottom cover.

In FIG. 2, the basic novel heat sink 41 is shown in perspective having a fluid porous metal foam core 43 which transmits fluid only down the tortuous path extending outwardly into fin 45, and then outwardly into fin 47 and then outwardly into fin 49, while avoiding a direct axial path through the heat sink 41. The forced fluid flow entering the porous metal foam 43 is usually lightweight oil such as "MOBIL ONE" and it is caused to pick up more heat because it actually flows out into the fins along a path which allows the fluid to pick up more heat because it is not axial but is tortuous with the cards giving up heat to the fins 45, 47 and 49, etc. which substantially shortens the path (L) of heat resistance from the heat source (PNB) to the fluid flow. The structure 41 is of course fluid-tight so that the fluid flow is confined to the foam metal which extends in zigzag fashion down the length of the heat sink 41.

Figure 3:
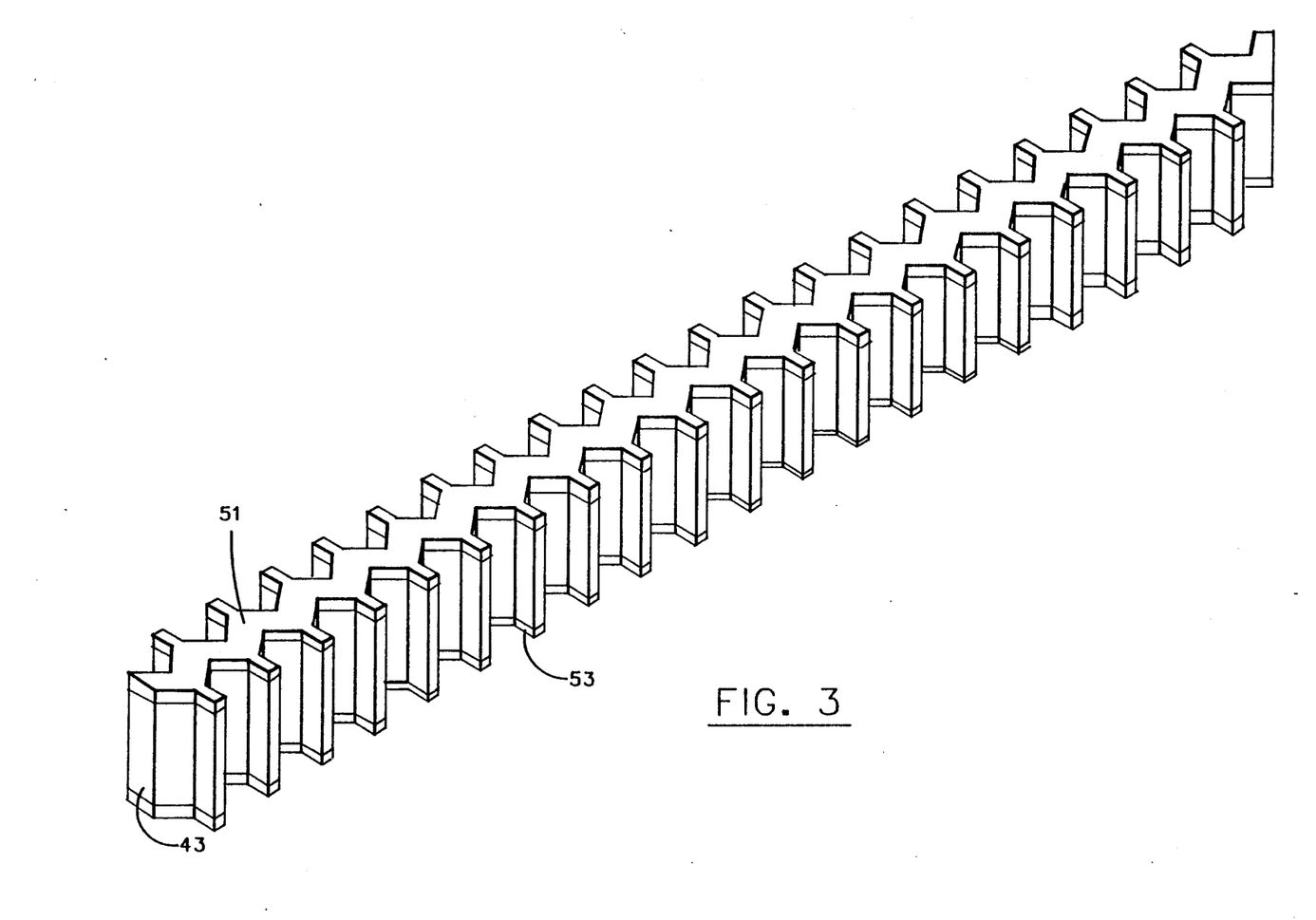
FIG. 3 is a view in perspective of the foam metal core with top and bottom covers configured to the zigzag shape of the metal foam.

In FIG. 3, a perspective view is shown of the configured metal foam 43 having a brazed-on aluminum top cover 51 and a corresponding bottom cover 53. Note, that the foam 43 and the top and bottom covers are precisely configured the same, which is done simultaneously.

Figure 4:
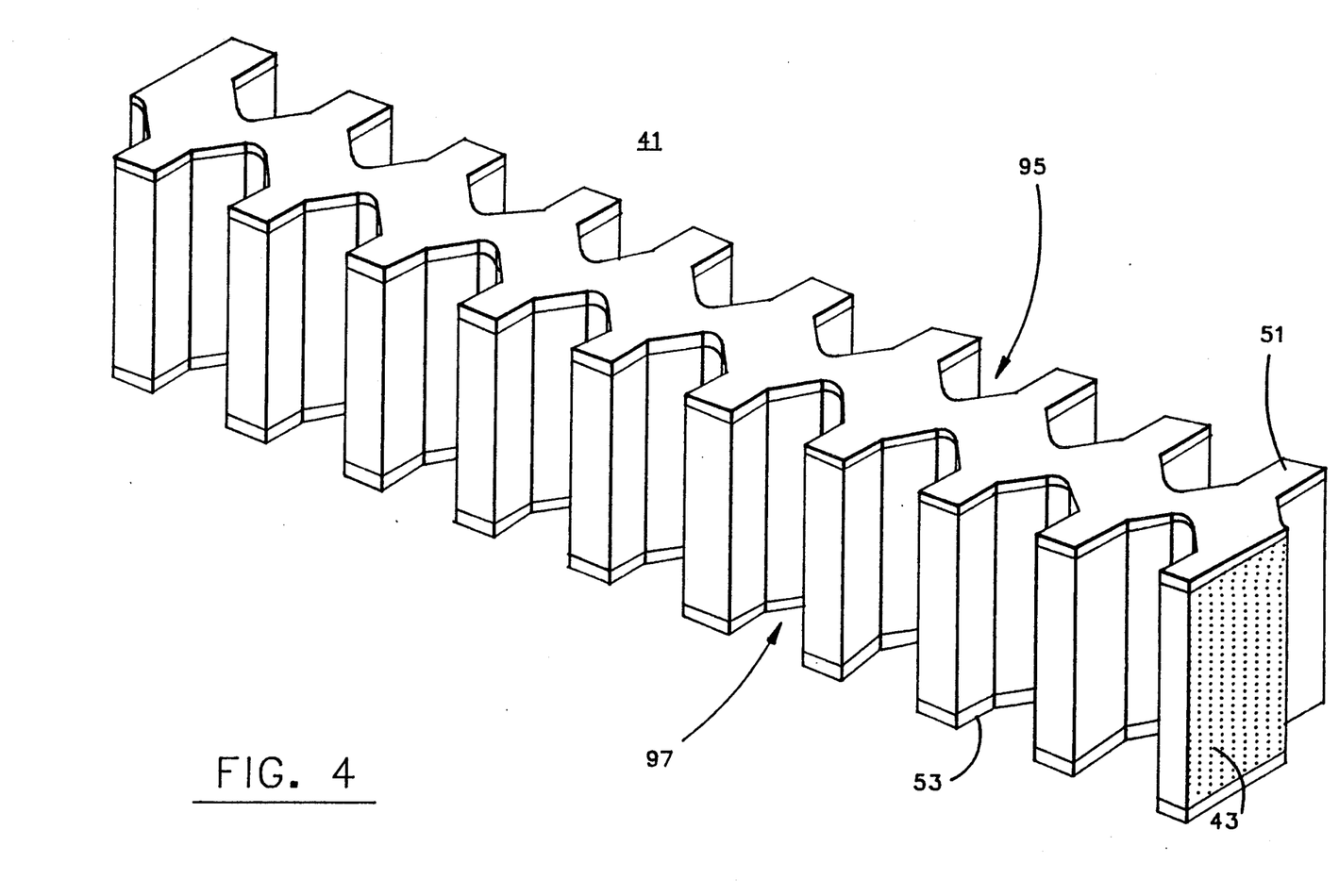
FIG. 4 is a perspective view of the foam metal core with top cover and bottom cover from a different angle than FIG. 2.
Figure 5:
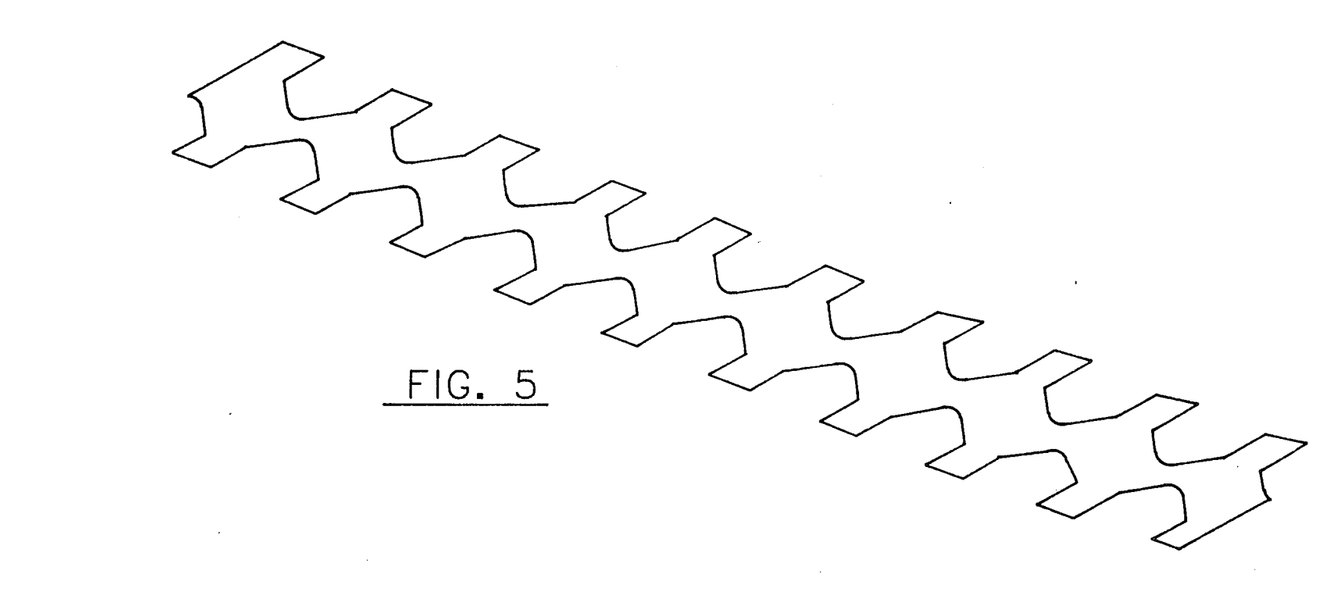
FIG. 5 shows the shape of the top cover in plan.
Figure 6:
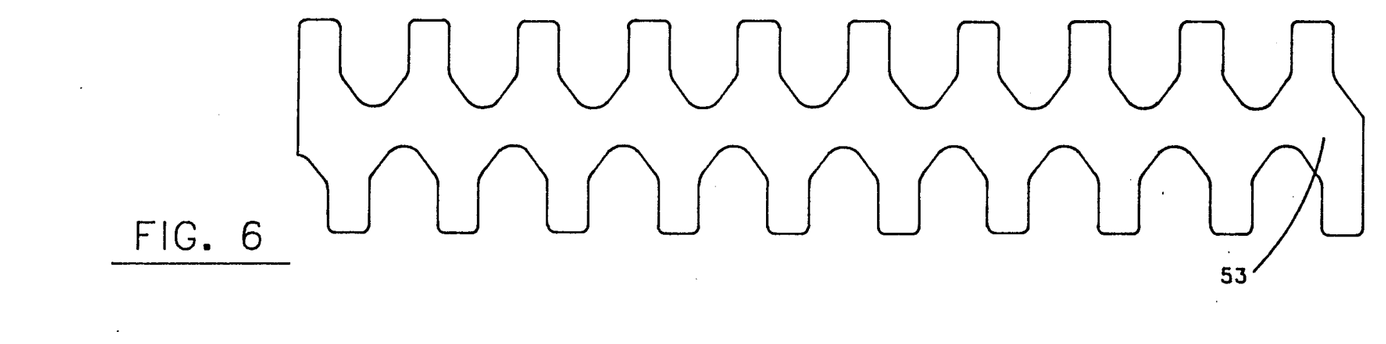
FIG. 6 shows the shape of the bottom cover in plan.

In FIG. 4, the exposed porous metal foam 43 is seen from one end of heat sink 41 with the top and bottom covers 51 and 53 in place. For example, the top cover for the foam 51 is shown in plan in FIG. 5 and is in place on the top of the foam metal 43 in FIG. 4. Similarly, the bottom cover 53 is shown in plan in FIG. 6 and is also shown in place in FIG. 4.

Figure 7:
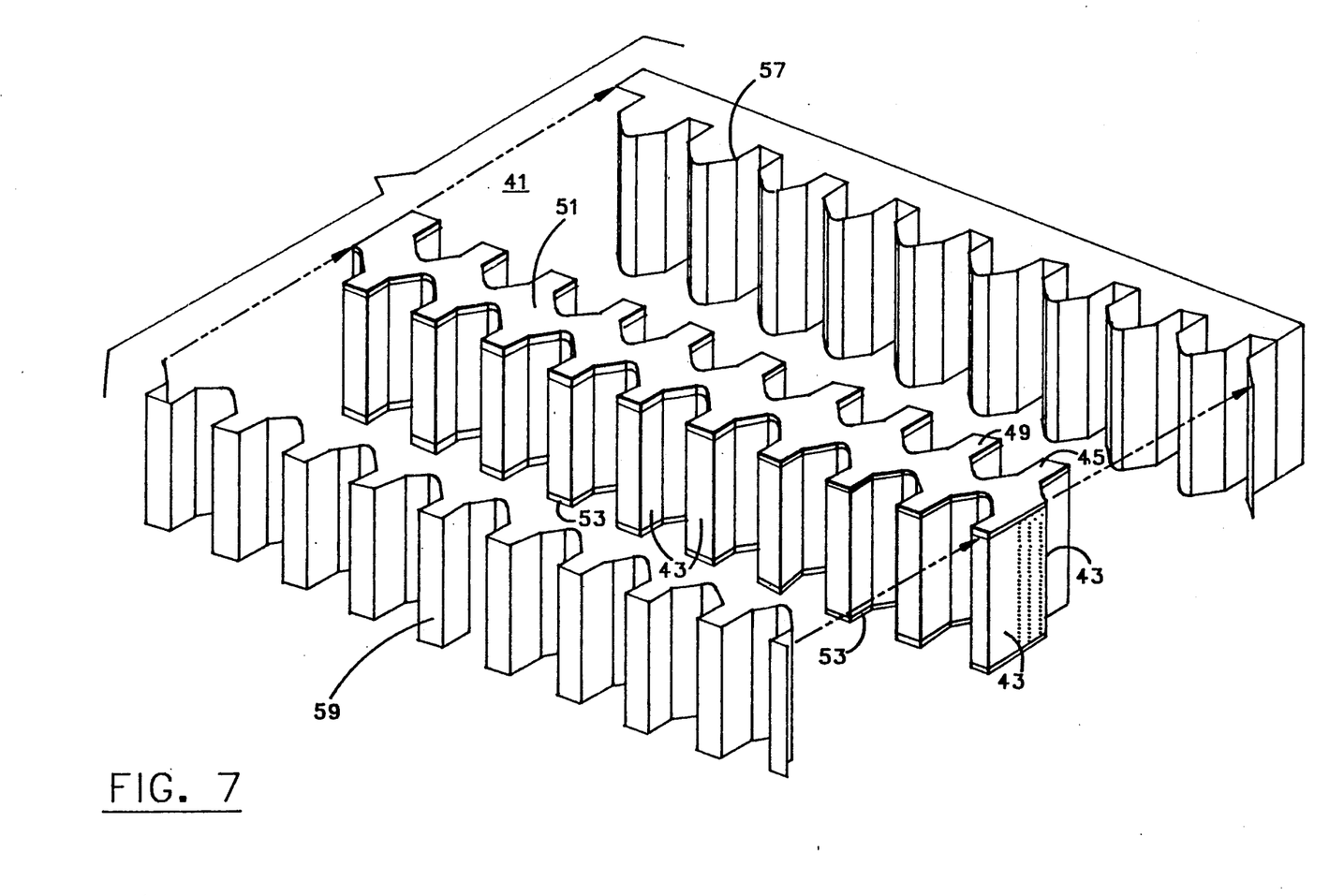
FIG. 7 shows the thin feeler plates configured to the shape of the core for juxtaposition therewith from both sides.

FIG. 7 shows a preliminary step to applying side covers for heat sink 41. The foam is shown at 43 covered only by top cover 51 and bottom cover 53. Feelers 57 and 59 are configured to conform to the profile of the fins, 45, 49, etc. and the spaces therebetween. The feelers are 5,000ths (0.005) inches in thickness and are preferably of light weight aluminum such that they will melt in the brazing process to fill in the gaps between the side covers 61 (FIG. 9) and 63 (FIG. 11) when the components are assembled and placed in the brazing oven.

Figure 12:
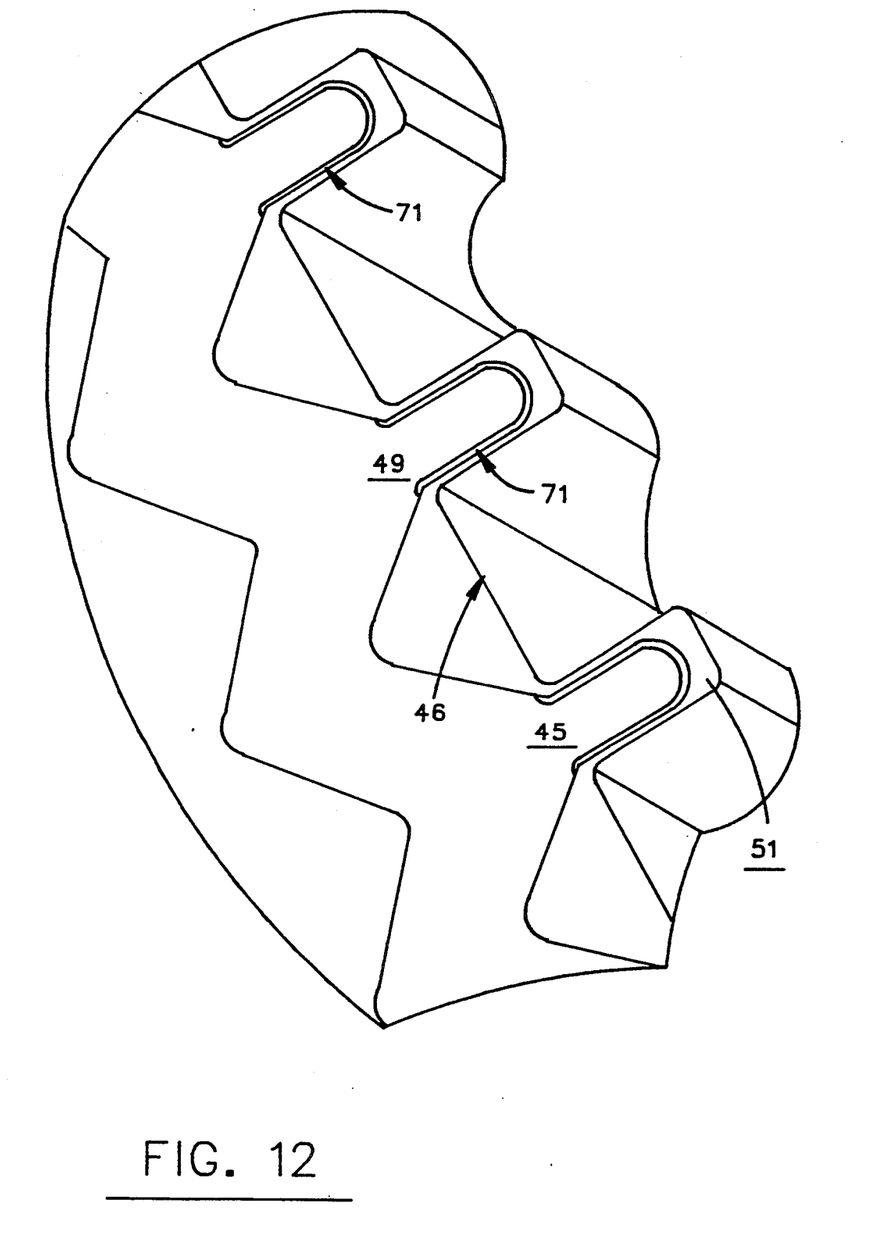
FIG. 12 shows a portion of the heat sink after mating and brazing, in magnified detail.

FIG. 12 shows an almost completed product taken from the brazing oven with the metal foam 43 zigzag shape showing in dotted lines as being totally enclosed.

Figures 8, 9, 10, 10A, 10B, 11:
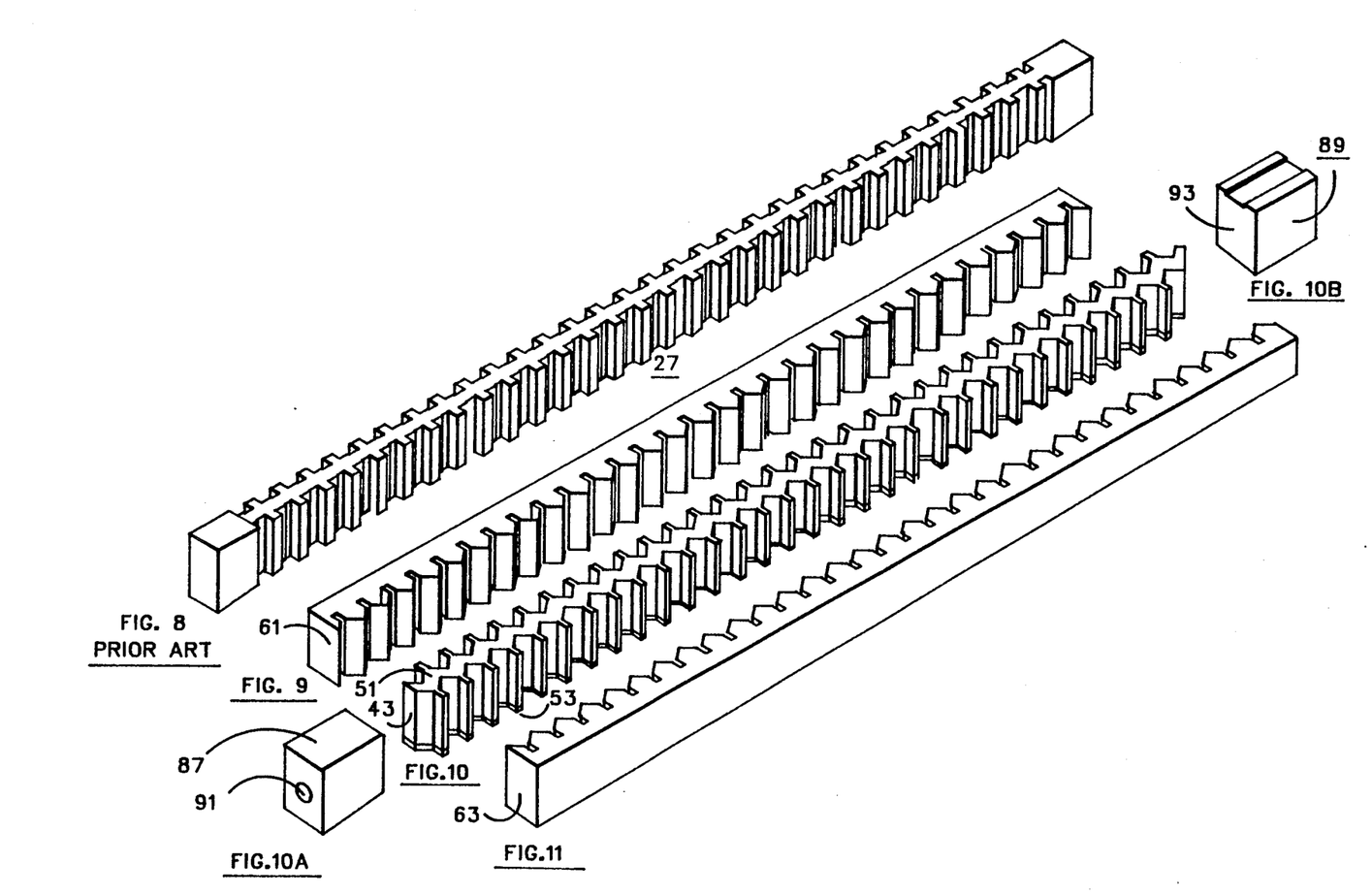
FIG. 8 shows a prior art heat sink in perspective.
FIG. 9 shows the left-hand cover plate configured the same as the foam metal core and top and bottom cover plates.
FIG. 10 shows the top and bottom covered porous metal core in position to mate with the side cover of FIG. 9.
FIG. 10a and FIG. 10b show terminal blocks for the heat sink.
FIG. 11 is a perspective view of the right-hand side cover ready to mate with the core configuration.

Comparing the outer right hand edge of FIG. 12 to the right cover side 63 of FIG. 11, it will be seen that the latter has been milled between adjacent pairs of fins so-formed, such as 45 and 49, best seen at 46. Now, the heat sink is an integral unit with the exception of the tiny slots 71 (FIG. 12) adjacent either side of the fins, such as 45 or 49. These slots are usually filled with epoxy or solder, or may be brazed or electron beam welded, to complete the sealing of the metal foam with its fluid path which extends into each fin.

Figure 24:
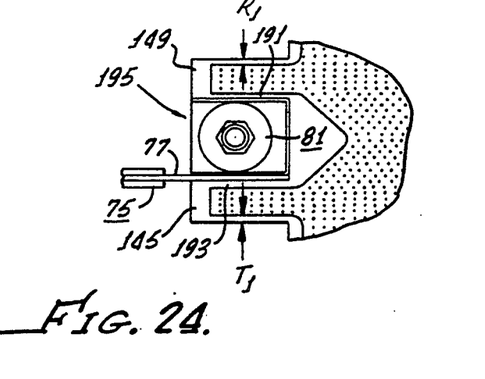
FIG. 24 is a top plan view of the wedge lock clamping the ground plate of a board between adjacent fins.

While viewing FIG. 12, it should be stated that the PWB cards 75 of FIG. 24 usually will have their metal ground plate 77 clamped in each recess 46 by a hexagonally nut driven wedge locking device 81 which fills the rest of the void or recess 46 and clamps the board firmly against the flanges where the liquid circulation is very closely adjacent, that is cutting down on the L dimension in the formula. This will be covered in detail infra.

Returning to the sheet of drawings including FIGS. 8, 9, 10, 10A and 10B, it will be seen that FIG. 8 merely sets forth the prior art, again shown at 27. FIGS. 10A and 10B show the blocks 87 and 89 which terminate each heat sink 41. Their purpose is two-fold, namely to cover the exposed porous metal foam 43, making a fluid tight connection with the side covers and top cover, being brazed thereto and provided with the valve having an opening in the opposite faces of the blocks 87 and 89 to control the admission of fluid. Such valves or valve openings are shown at 91 and 93.

First, a rectangular block of the porous metal foam is obtained from Energy Research and Generation Company of Oakland, Calif. The foamed linear rectangular block includes the top and bottom covers 51 and 53 but without configurations, i.e. no shaping has been done and again, this is simply purchased as a rectangular elongated block having the foam exposed on both sides and at both ends. It is understood that the top and bottom cover plates have been brazed to the foam 43.

The second step in the process is to employ a conventional programmed electric discharge machine (EDM) simultaneously to cut the irregular slots, e.g., 95 and 97 of FIG. 4 into all three of the top plate 51, porous metal 43 and bottom plate 53. The EDM machine is programmed to make these precise cuts continuously while the foam and top and bottom plates are immersed in water. Wires make the transitions into the cuts but do not actually touch the material, simply providing energy for the precise machining necessary to obtain the shapes of FIGS. 4, 5 and 6. This machine has several settings, and if the 5,000 mil setting is used, a slow procedure provides a very smooth cut. If the 8,000 mil cutting is used, the cutting is faster but the material is not quite so smooth. If the 11,000 mil setting is used, a large gap is formed and two feelers 57, 59 may be employed on each side of the foamed metal to fill the large gap encountered between the side covers and the foam.

While all of these settings may be employed, it is typical to use the 8,000 mil setting.

Figure 13:
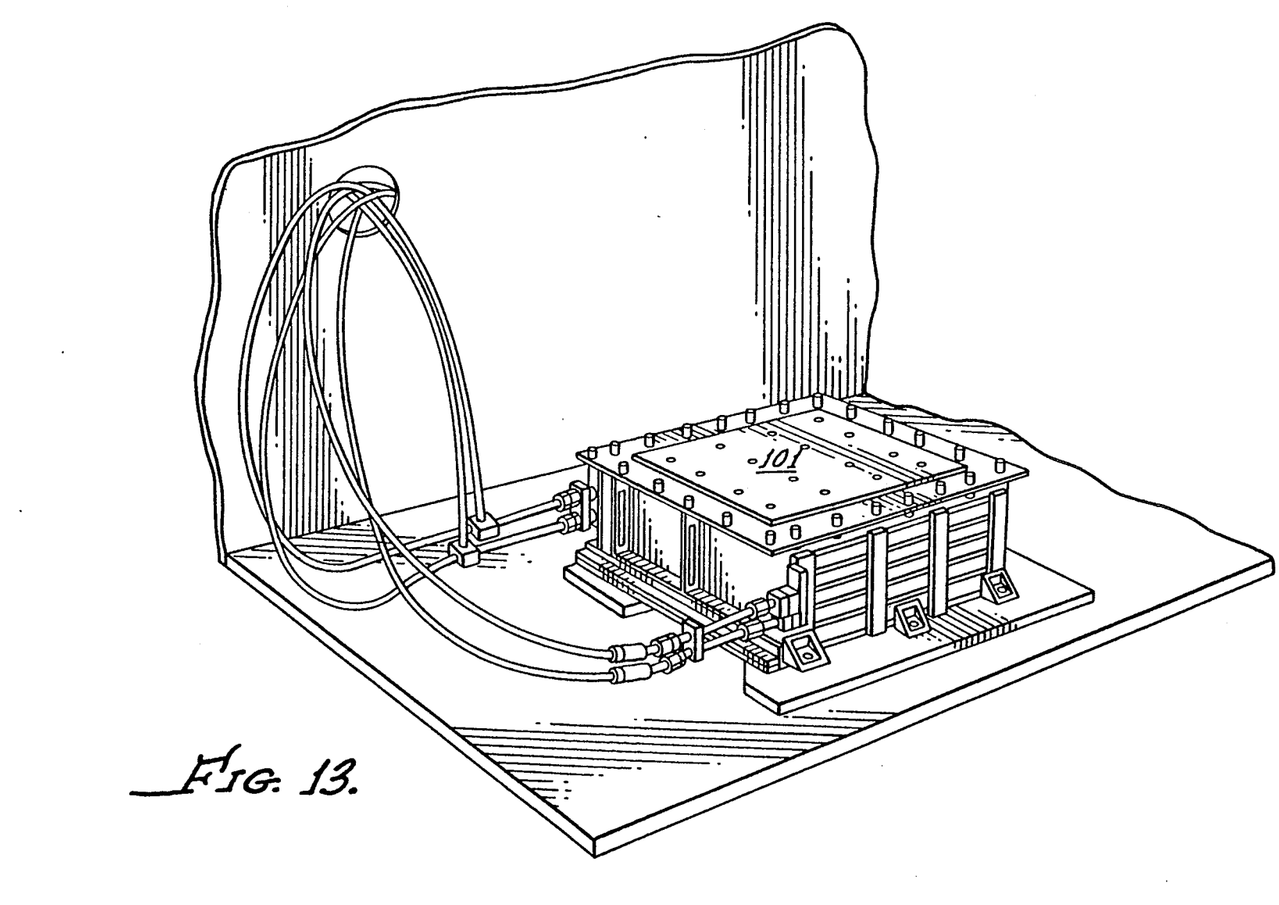
FIG. 13 is a typical rack box useful in containing the heat sinks and shown with input and output fluid connections.
Figures 14, 19A, 19B:
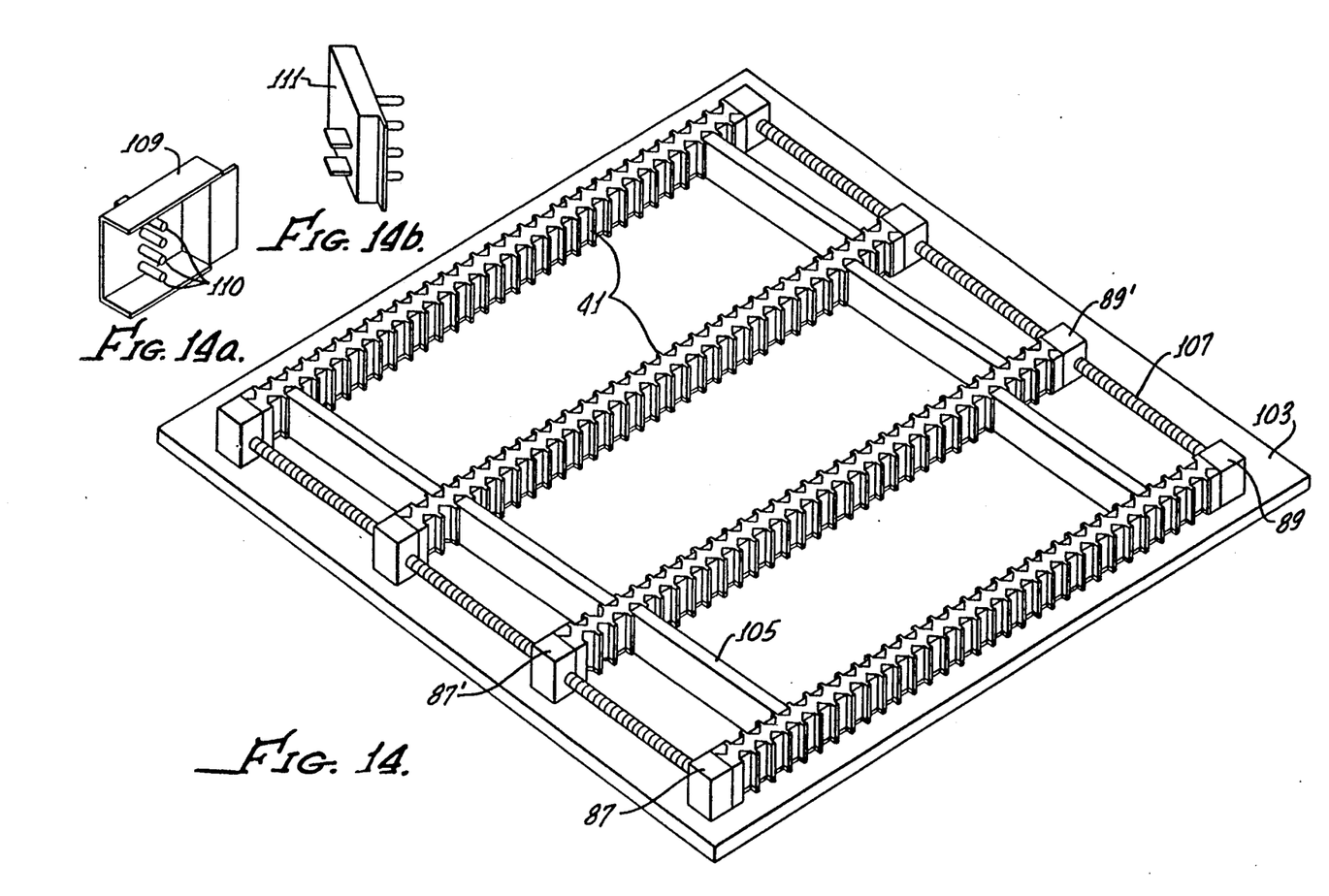
FIG. 14a and 14b are perspective views of four of the racks deployed in spaced apart relation on the bottom cover and interconnected by bellows with the inlet and outlet manifold adjacent to the heat sink terminating blocks to which they will connect.
FIG. 19 is a detailed cross sectional view showing the graphite frame bonded to an upper and lower heat sink.

Referring to FIGS. 7 and 11, the core 43 with top plate 51 and bottom plate 53 is placed into a jig and the appropriate number of feelers 57 and 59 are pressed into the lateral openings of the core. Then the side covers 61 and 63 are pressed tightly against the feelers and core, and the two end blocks 87 and 89 are placed against the ends of the foam metal. A spring loaded tool maintains this assembled position of all the components mentioned while it is put into a vacuum brazing oven (pasteless) and heated to braze the components together, including melting the feelers so that they actually disappear. Thereafter, the gaps 71 of FIG. 12 are filled with epoxy and the integral heat sink units are finished, ready for assembly into a container 101 of FIG. 13 capable of withstanding heat and pressure and circulating the light oil throughout the heat sinks 41 to carry away the heat from the printed wiring boards. It is possible to use a conventional box for this purpose, but it must include the heat sinks 41 of the present invention, as shown in FIG. 14. But, for the present lightweight rack, these heat sinks are affixed to rigid top and bottom plates, such as 103 in FIG. 14, while being spaced apart by the fixtures 105, temporarily. Bellows type conduits 107 are connected between the end blocks, e.g., 89–89'. The heat sinks 41 are usually called cold plates, particularly when assembled.

FIG. 14 shows one layer of the heat sink construction, and four or five layers are required to accommodate tile height of each board. Accordingly, the fluid inlet and outlet manifold connectors 109 and 111 each include four short conduits 110 for connection to the respective layers.

Figure 15:
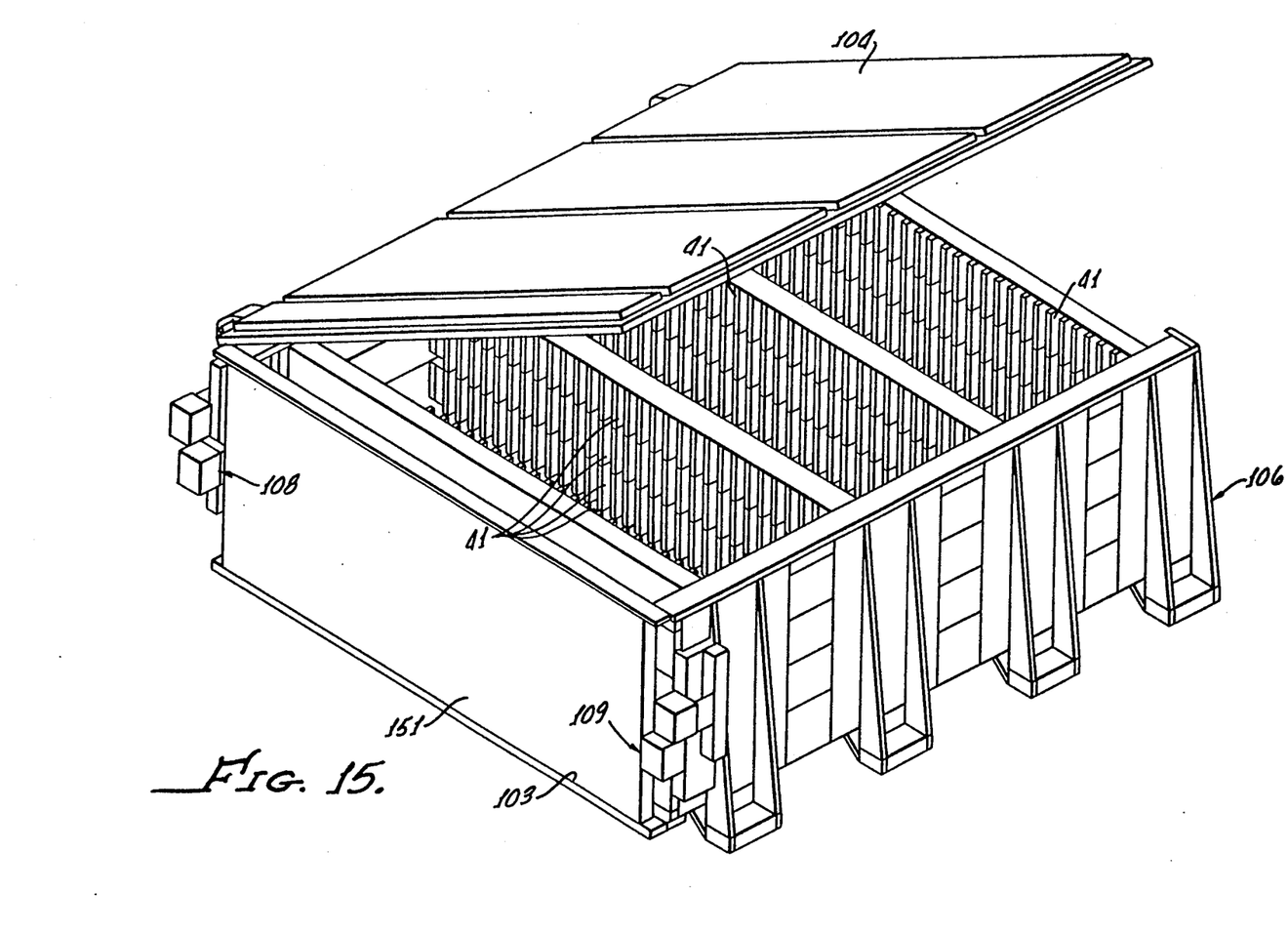
FIG. 15 is a perspective view of the lightweight box and rack assembled together with the top cover or lid being partially opened.

FIG. 15 shows a completed rack box having four levels of heat sinks 41, stacked in the locations shown in FIG. 14.

Figure 16:
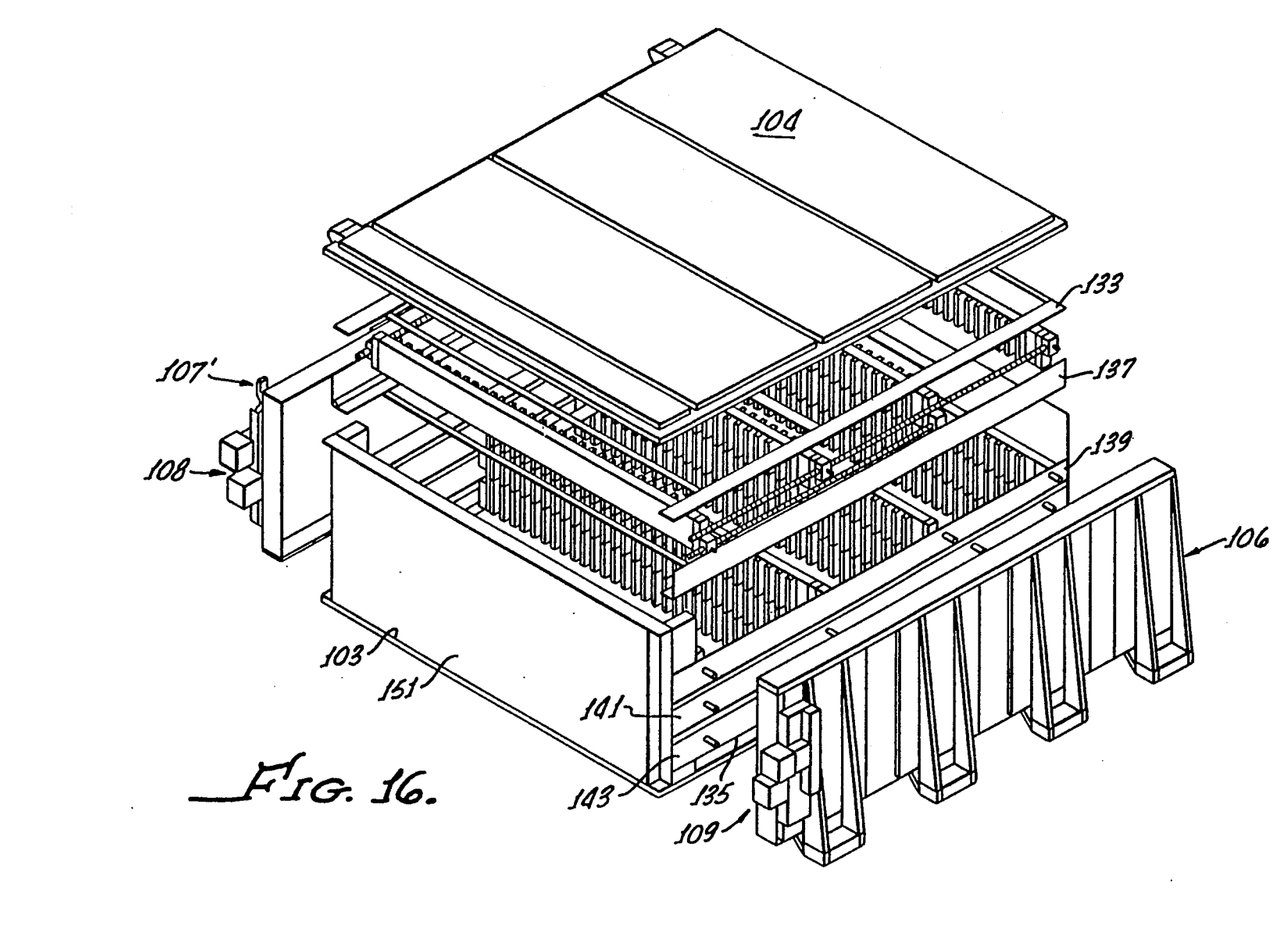
FIG. 16 is an exploded view of the structure of FIG. 15 to show further parts thereof.
Figure 17:
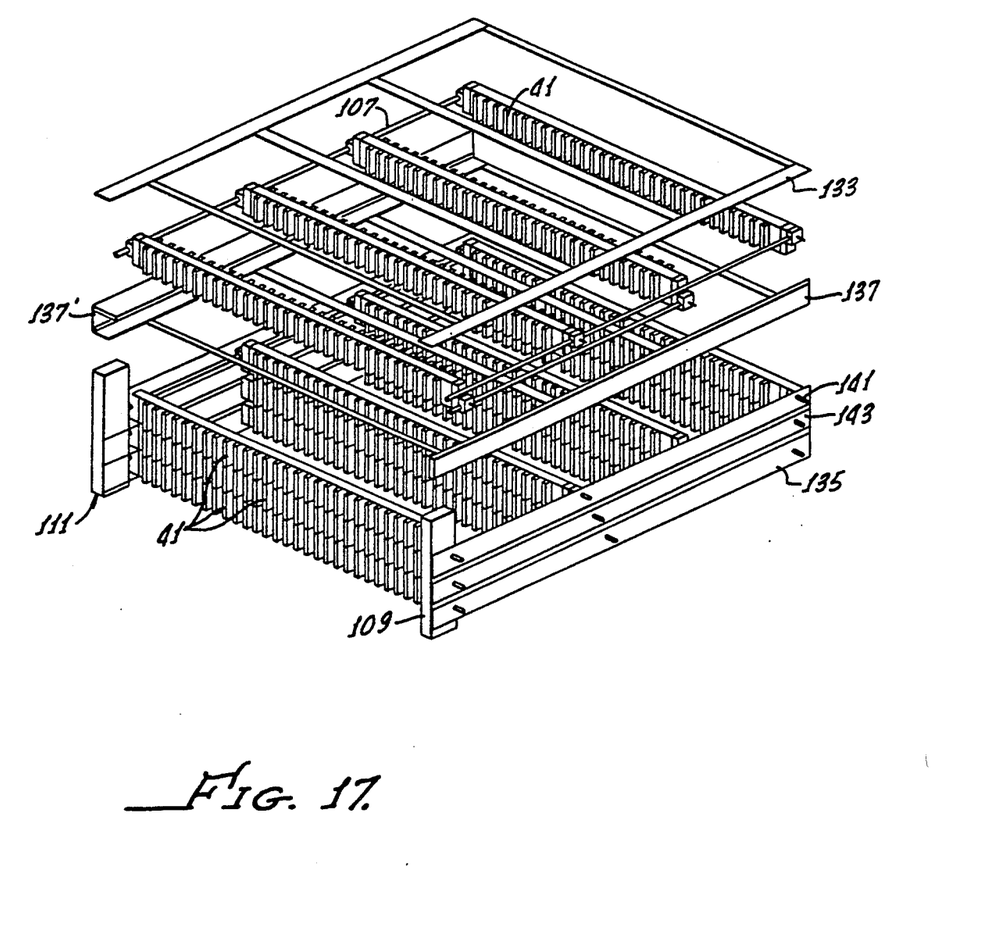
FIG. 17 is an exploded view of the rack, per se, which fits within the box.
Figures 18, 19:
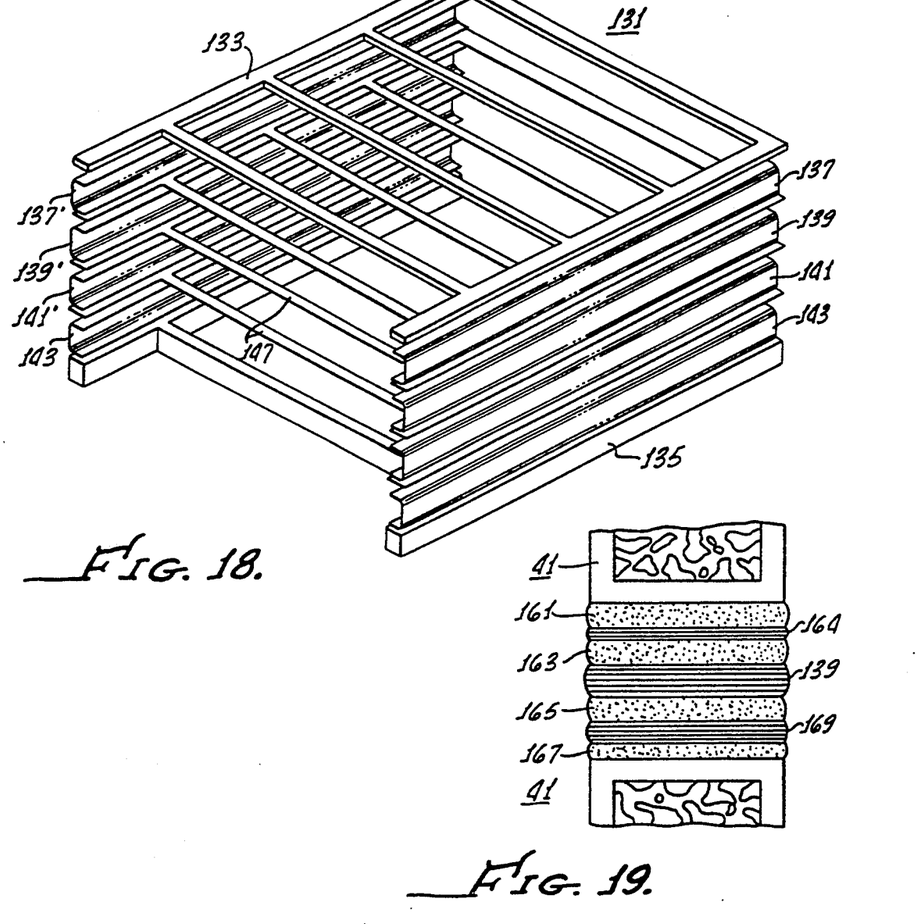
FIG. 18 is a perspective view of the graphite frame which bonds between the cold plates and fixes them in position.
Figure 20:
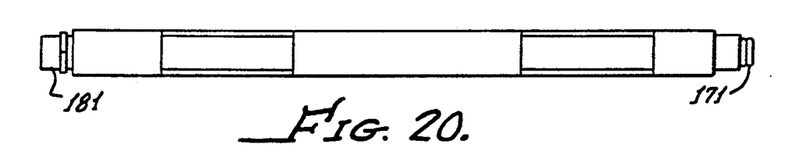
FIG. 20 is a view in side elevation of a preferred wedge locking device for clamping the boards against the thin walled fins of the heat sink.
Figures 21, 22:
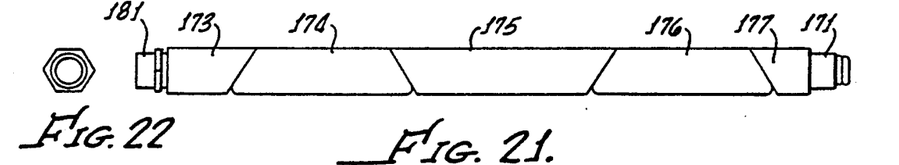
FIG. 21 shows the device of FIG. 20 cut in segments on the bias to permit displacement of one or more segments when tightened.
FIG. 22 is an end view of FIG. 21.
Figure 23:
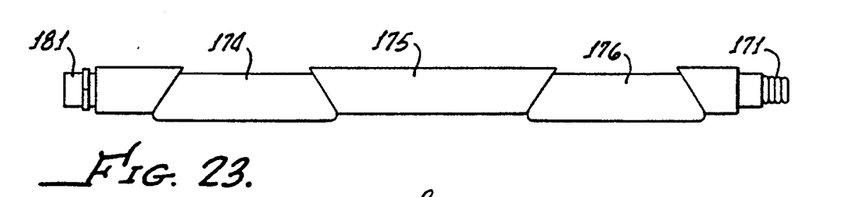
FIG. 23 shows the wedge lock tightened into locking position to clamp the board between adjacent fins.

FIGS. 16 and 17 show exploded views of the lightweight configuration of the PCB rack, which is preferably constructed of composite materials. FIG. 18 shows the lightweight graphite channels.

In these FIGS., the top 104 and bottom 103 are preferably porous metal cores 105 (FIG. 16) with aluminum cover plates. They include conventional built-in EMI (electro magnetic impulse) shielding. The footage members 106 and 107 are lightweight material and carry the manifolds 108 and 109. The footage members 106 and 107' are bonded to the other structure and include conventional built-in damping. The connector or dummy plate 151 bolts to the bonded structure.

In FIG. 17, the liquid transfer bellows or tubes 107 (see also FIG. 14) are bonded to the cold plate assembly using LOCTITE RC/680 tube-bonding adhesive. The cold plate 41 and the window frames are bonded together using HYSOL and #EA 9395 Epoxy, the window frames being between the stacked cold plates 41 (FIGS. 18 and 19).

In FIG. 18, the graphite frame 131 is shown with a top flange 133 and a bottom flange 135. It includes the four window frame channels 137, 139, 141, and 143 with cross frame members 147 to correspond to the oppositely disposed four frames 137', 139', 141' and 143'. It is HYSOL bonded together. The purpose of the graphite unit is to fit within the box 151 of FIG. 15 to receive and hold the heat sinks 41. This is better seen in FIG. 19, wherein two units 41 are shown in cross-section with epoxy bonding material 161 and 163 sandwiching a layer of fiberglass 164 supported by the graphite channel 139 with the similar structure of epoxy 165 and 167 sandwiching fiberglass layer 169 below the graphite in connection with the lower heat sink 41. It has been found that the fiberglass 164 and 169 is really not essential and the cost can be reduced somewhat by removing layers 164 and 169.

Finally, FIGS. 20 through 24 show the preferred way of clamping the boards against the thin-walled fins, as shown in FIG. 24 to ensure low resistance heat transfer out of the boards as quickly as possible to the moving fluid. The wedge locking device 81 simply includes an elongated screw 171 extending through five pieces of tubing 173, 174, 175, 176, and 177. These five pieces of tubing are cut on 45 degree angles so that when the hexagonal nut 181 is turned, as thus shown in FIG. 23, the two pieces 174 and 176 are wedged in one direction relative to the pieces 173, 175, and 177 to ensure tightening of the board ground member 77 (FIG. 24) against the walls 191 and 193 of the recess 195 between adjacent fins 149 and 145 of FIG. 24. Of course, the same would be true in FIG. 12 with respect to the recess 46. The board would be clamped on the upper side of rib 45 and the next board would be clamped on the upper side of rib 49 so that the entire board could leak heat to single ribs on each end.

By way of example, for a 5.5 inch by 5.95 inch card, $R_1$ of FIG. 24 is 0.050 inches thick (wall 193) and wall 191 ($T_1$) is 0.065 inches thick for the fins 145 and 149.

In keeping with the lightweight construction, the preferred material for the many devices 81 is aluminum whenever a lightweight composite is not used.

What is claimed is:

1. The method of making a heat sink for use in a fluid controlled system, comprising the steps of:

forming an axially extending block of fluid porous foam metal;

brazing a top cover and a bottom cover to said block;

using a programmed electrostatic discharge machine to configure the foam metal, top and bottom covers into a zigzag shape;

placing at least one conforming feeler on each side of the foam metal;

forcing the feelers tightly against the foamed metal, top and bottom covers by zigzag conforming side covers; and, using a vacuum brazing oven to braze together the foam metal, top and bottom covers, feelers and side covers into an integral unit for receiving axial fluid flow via the foamed metal.

2. The method of claim 1 including the further step of:

filling any gaps in the heat sink with epoxy to insure fluid tightness; and, milling slots into the side covers at spaced apart positions therealong with the slots of the sides being staggered so they are not directly across from each other.

3. The method of claim 2, comprising the further steps of:

assembling a plurality of the heat sinks in spaced apart stacked array in a rigid box;

connecting the heat sinks together for fluid flow and to an inlet fluid manifold and an outlet fluid manifold; and, clamping printed wiring boards adjacent the fins of spaced apart stacked arrays of heat sinks whereby circulation of cooling fluid through the heat sinks rapidly removes heat from said boards due to the close proximity of the circulating fluid to the board.

* * * * *